(12) United States Patent
Suzuki et al.

(10) Patent No.: US 8,784,938 B2
(45) Date of Patent: Jul. 22, 2014

(54) METHOD FOR FABRICATING FUNCTIONAL FILM

(75) Inventors: Naoki Suzuki, Osaka (JP); Takao Nagumo, Kanagawa (JP); Hidehiro Yoshida, Osaka (JP); Hiroshi Hayata, Osaka (JP); Masahiro Muro, Osaka (JP)

(73) Assignee: Panasonic Corporation, Osaka (JP)

( * ) Notice: Subject to any disclaimer, the term of this patent is extended or adjusted under 35 U.S.C. 154(b) by 446 days.

(21) Appl. No.: 12/794,906

(22) Filed: Jun. 7, 2010

(65) Prior Publication Data
US 2010/0311298 A1 Dec. 9, 2010

(30) Foreign Application Priority Data

Jun. 8, 2009 (JP) .................................. 2009-136983
Apr. 26, 2010 (JP) .................................. 2010-100730

(51) Int. Cl.
*B05D 1/36* (2006.01)
*B41J 2/21* (2006.01)
*H01L 51/00* (2006.01)
*B41J 2/155* (2006.01)

(52) U.S. Cl.
CPC ............... *B41J 2/155* (2013.01); *B41J 2/2139* (2013.01); *H01L 51/0005* (2013.01); *B41J 2/2146* (2013.01); *B41J 2202/09* (2013.01)
USPC .......................................... 427/258; 427/66

(58) Field of Classification Search
USPC ................................................ 427/66, 258
See application file for complete search history.

(56) References Cited

U.S. PATENT DOCUMENTS

| 7,195,334 | B2 | 3/2007 | Nakamura | |
| 2003/0085949 | A1 * | 5/2003 | Koitabashi et al. | 347/43 |
| 2003/0103098 | A1 * | 6/2003 | Yashima et al. | 347/15 |
| 2004/0119776 | A1 | 6/2004 | Nakamura | |
| 2005/0005996 | A1 * | 1/2005 | Mizutani | 141/25 |
| 2006/0125869 | A1 * | 6/2006 | Mitani et al. | 347/19 |

FOREIGN PATENT DOCUMENTS

| JP | 2000-284113 | 10/2000 |
| JP | 2001-194519 | 7/2001 |
| JP | 2003-266669 | 9/2003 |
| JP | 2004-142422 | 5/2004 |
| JP | 2004-362818 | 12/2004 |
| JP | 2005-67049 | 3/2005 |
| JP | 2008-36575 | 2/2008 |
| JP | 2008-80207 | 4/2008 |
| JP | 2009-86155 | 4/2009 |

* cited by examiner

*Primary Examiner* — Michael Cleveland
*Assistant Examiner* — Xiao Zhao
(74) *Attorney, Agent, or Firm* — Wenderoth, Lind & Ponack, L.L.P.

(57) ABSTRACT

A functional-film fabricating method includes applying a coating by ejecting droplets of functional liquid from plural nozzles to ejection areas for forming a functional film which are surrounded by bounded areas having a liquid repellent property, during a single scanning. In applying the coating, when there is a non-ejectable nozzle out of plural nozzles to be used for applying a coating to a single ejection area, the amount of droplets of the functional liquid ejected from another ejectable nozzle to be used for applying a coating to this ejection area is larger than that of cases where there is no non-ejectable nozzle.

6 Claims, 10 Drawing Sheets

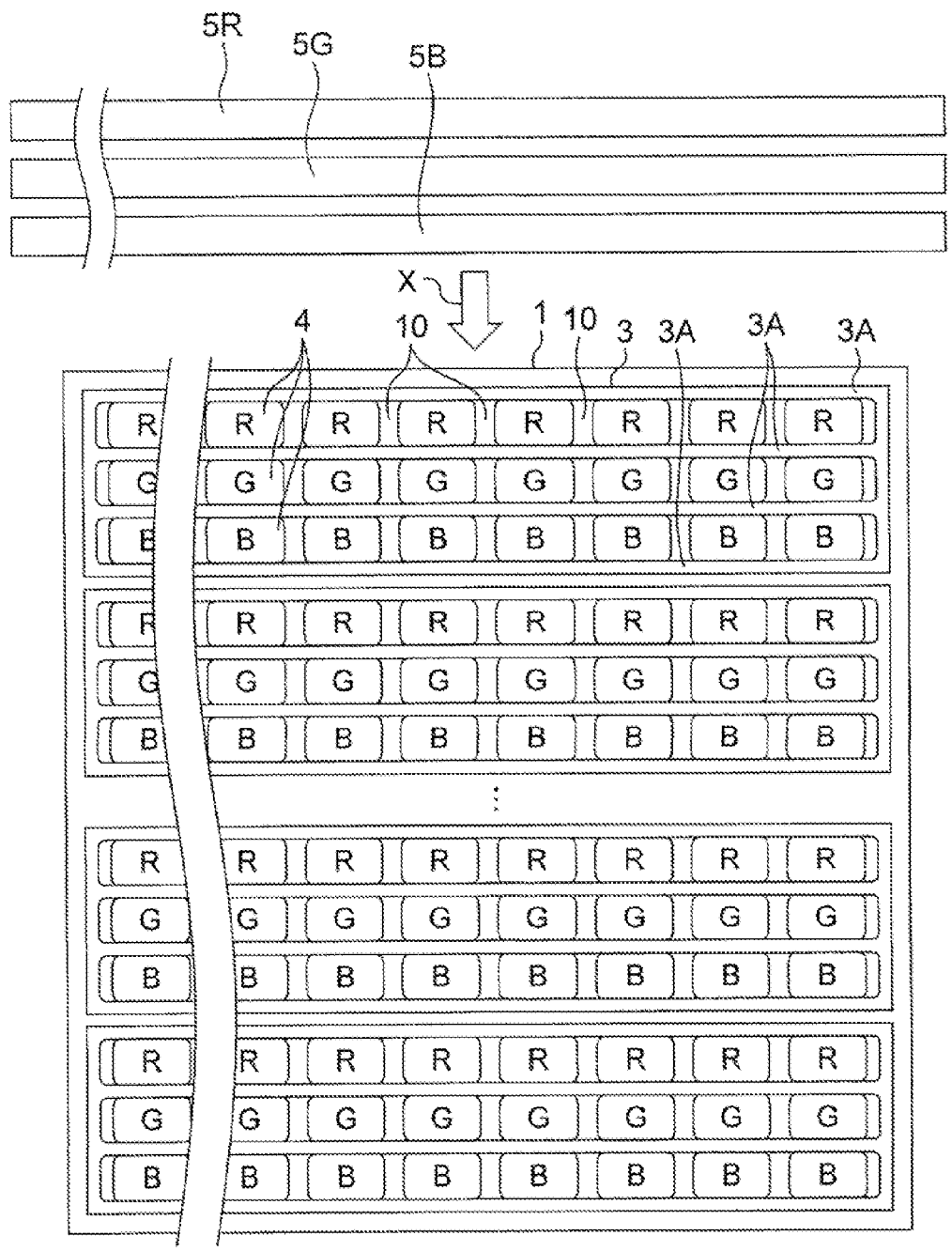

⇩ DIRECTION OF SCANNING (1) ⇩ DIRECTION OF SCANNING (2) ⇩ DIRECTION OF SCANNING (1) ⇩ DIRECTION OF SCANNING (2) ⇩ DIRECTION OF SCANNING (1) ⇩ DIRECTION OF SCANNING (2) ⇩ DIRECTION OF SCANNING

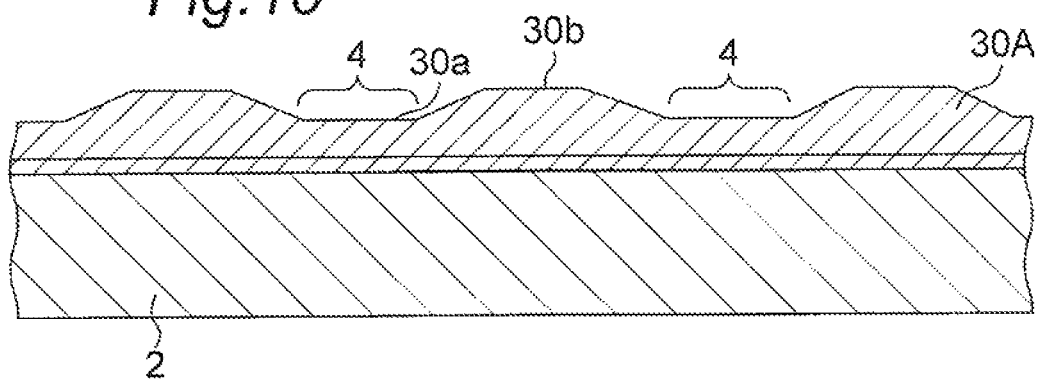
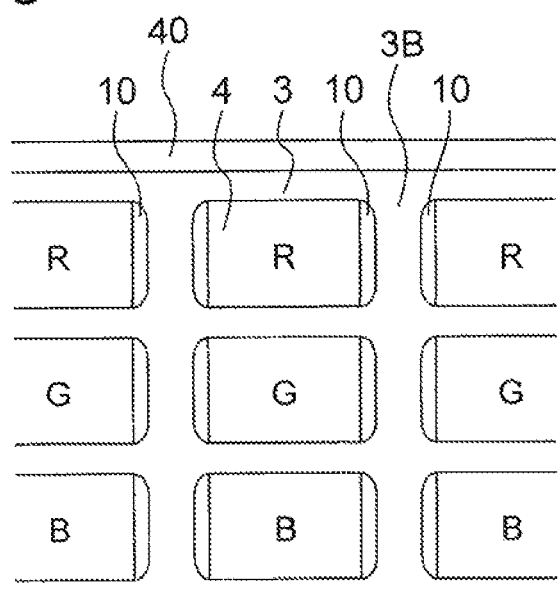

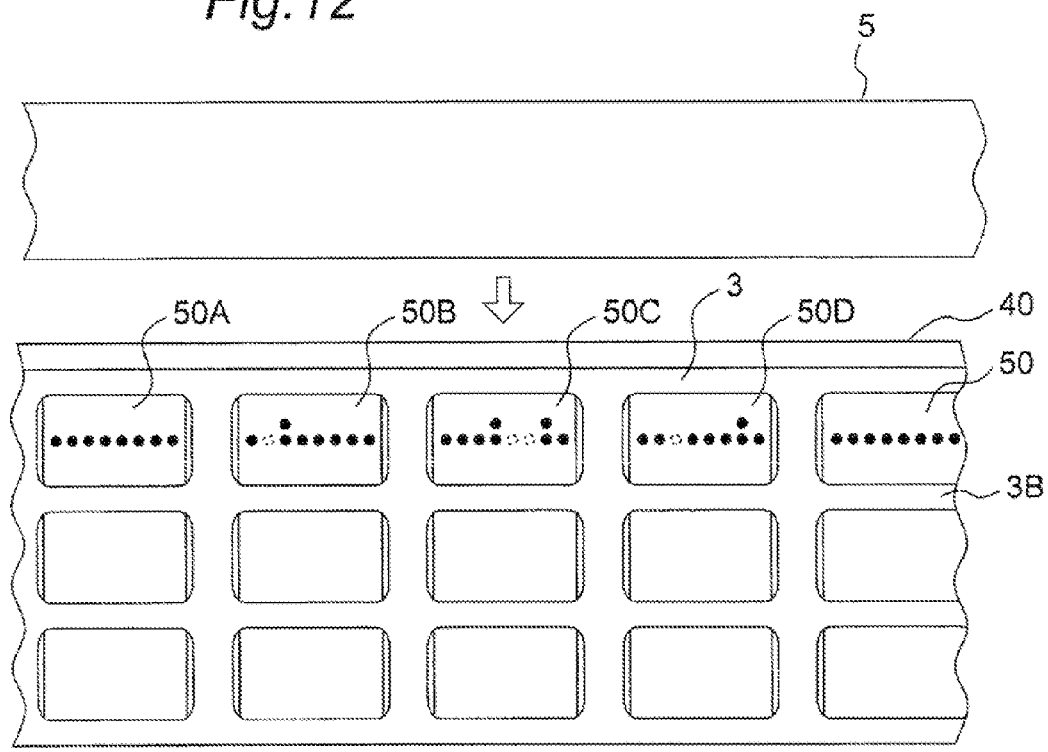

METHOD FOR FABRICATING FUNCTIONAL FILM

BACKGROUND OF THE INVENTION

I. Technical Field

The present invention relates to a method for fabricating a functional film and relates to, for example, a method for fabricating an organic electro-luminescence display (hereinafter, abbreviated as an organic EL display). More specifically, the present invention relates to a functional-film fabricating method including forming an organic light-emitting layer and the like using an ink jet apparatus.

II. Description of the Related Art

Organic EL displays are broadly divided into two types as follows, based on the method for forming organic light emitting layers. One type is a method which forms organic light-emitting layers through vapor deposition and is used in cases where the organic light-emitting layers are made of low molecular organic materials. The other type is a method which forms organic light-emitting layers through solvent coating methods and is used in cases where the organic light-emitting layers are made of low-molecular organic materials, as a matter of course, and also in cases where they are made of high-molecular organic materials.

As one of representative means for forming organic light-emitting layers through solvent coating methods, there is a method which forms an organic light-emitting layer by ejecting droplets of ink containing an organic light-emitting material to pixel areas on a display substrate to form an organic light-emitting layer, using an ink jet apparatus (refer to JP-A No. 2004-362818, for example). In this case, the ejected ink droplets contain an organic light-emitting material and a solvent.

General ink jet apparatuses include ink jet heads having plural nozzles and are adapted to eject ink from the nozzles while controlling the positional relationship between the nozzles in the ink jet heads and a substrate (refer to JP-A No. 2003-266669, for example). JP-A No. 2003-266669 discloses forming pixels having a predetermined line width, through spreads of droplets accreted on a substrate in isotropic directions.

In an ink jet apparatus, if a time interval for causing an ink jet head to eject droplets is interrupted only slightly (for example, an interruption of ejection for 60 seconds), a non-ejectable is induced and, further, even at a continuous ejection state, a non-ejectable nozzle may be induced in some cases. Therefore, in general, recovery processing for sucking ink from such non-ejectable nozzles and the like have been performed (refer to JP-A No. 2004-142422, for example). Further, there has been suggested a method which, in the event of occurrence of a non-ejectable nozzle, performs complementing for the areas to be originally subjected to recording through the non-ejectable nozzle, while keeping the non-ejectable nozzle as such (refer to JP-A No. 2000-284113 and JP-A No. 2005-67049, for example). JP-A No. 2000-284113 discloses a method which performs complementing for areas to be originally subjected to coating through non-ejectable nozzles, by displacing the positions of other nozzles. Further, JP-A No. 2005-67049 discloses an ink jet head including two nozzles parallelly arranged in the direction of scanning for use in applying a coating to the same areas and, further, suggests a method which, if one of the arranged nozzles becomes a non-ejectable nozzle, performs complementing using the other ejectable nozzle and, also, a method which, if both of the two nozzles are non-ejectable nozzles, performs complementing by applying a coating only to areas adjacent to the to-be-coated areas using an ejectable nozzle adjacent to non-ejectable nozzles. However, the ink jet head disclosed in JP-A No. 2005-67049 is a device for recording images formed from dot patterns on recording mediums such as paper sheets, plastic thin plates and the like. Thus, this ink jet head is different from an ink jet apparatus for use in functional-film fabricating methods for forming organic light-emitting layers, in terms of objects to be subjected to coating.

FIGS. 13A and 13B illustrate an example of an ink jet head disclosed in JP-A No. 2005-67049 and a result of recording on a recording medium as an object to be subjected to coating using the ink jet head. FIG. 13A illustrates the placement of ejectable nozzles and non-ejectable nozzles in the ink jet head. FIG. 13B illustrates the result of recording on a recording sheet 24 using the ink jet head illustrated in FIG. 13A. In FIG. 13A, a reference character 21 designates the ink jet head, a reference character 22 designates ejectable nozzles (diagonal-line circles) which eject ink, and a reference character 23 designates non-ejectable nozzles (white circles) eject no ink. In cases of applying a coating of ink to the recording sheet 24 using the ink jet head 21 having the two nozzles parallelly arranged as described above, there are formed areas 25 (diagonal-line circles) coated with a normal amount of droplets of the ink. If there are arranged nozzles both of which are non-ejectable nozzles, there are formed white-line areas 27 (white circles) induced by these non-ejectable nozzles, and also there are formed areas 26 (black circles) to which the ejectable nozzles adjacent to the white-line areas 27 have alternately applied a coating with a doubled amount of droplets. The ink jet head 21 disclosed in JP-A No. 2005-67049 is adapted to eject ink the recording sheet 24 as described above, in order to cause the non-ejected areas (the white-line areas 27), which are the areas of the recording sheet 24, and which can not be coated with the ink, to be visually inconspicuous.

The recovery operation disclosed in JP-A No. 2004-142422 is adapted to cover non-ejectable nozzles with caps and to suck ink from these non-ejectable nozzles. In order to perform this recovery operation, it has been necessary to perform recovery operations by covering the nozzles with the caps and, then, perform operations for removing the caps and for restoring the original droplet ejection state after the completion of the recovery operation. This has induced a time loss, which has been unpreferable in view of the productivity improvement. Further, in some cases, it has been impossible to completely recover non-ejectable nozzles, even by performing such recovery operations. Therefore, as a method for performing complementing without performing recovery operations on non-ejectable nozzles, there has been recording methods disclosed in JP-A No. 2000-284113 and JP-A No. 2005-67049 as described above, although these methods are different in terms of objects to be coated with ink.

The recording method disclosed in JP-A No. 2000-284113 is a method which performs complementing by re-scanning the areas to be originally coated through non-ejectable nozzles, while displacing the positions of other ejectable nozzles. This increases the number of scannings with the number of induced non-ejectable nozzles, which has been unpreferable in view of the productivity improvement.

Further, regarding the ink jet head including two nozzles arranged in the direction of scanning, which is disclosed in JP-A No. 2005-67049, there has been suggested a method which, if one of the arranged nozzles is a non-ejectable nozzle, performs complementing using the other ejectable nozzle and, if both of the arranged nozzles are non-ejectable nozzles, performs complementing using an adjacent ejectable nozzle. In cases where both the arranged two nozzles are non-ejectable nozzles and an ejectable nozzle adjacent thereto is used for complementing, the amount of launched droplets is increased at the same position, without changing the position of this adjacent ejectable nozzle. In cases of using this recording method for a functional-film fabrication method, the amount of ink droplets is increased at the same position and, in cases where the respective coating areas for R (red), G (green) and B (blue) are arranged, for example, there is a high possibility that the ink intrudes into the adjacent areas and color mixing occurs, due to the vibration caused by the accretion of droplets and the error of droplet shot accretion positions. Further, in the event of occurrence of continuous two or more non-ejectable nozzles, out of the nozzles arranged in the direction orthogonal to the direction of scanning, the number of droplets is increased at the same position, which degrades the film uniformity, thereby inducing the problem of difficulty of performing predetermined complementing.

The present invention was made in view of the problems induced in formation of functional films using conventional ink jet apparatuses and aims at providing a functional-film fabricating method capable of certainly forming uniform functional films without degrading the productivity, in the event of occurrence of continuous two or more non-ejectable nozzles, out of nozzles in an ink jet apparatus.

SUMMARY OF THE INVENTION

According to a first aspect of the present invention, there is provided a functional-film fabricating method which is a functional-film fabricating method for applying a coating of a functional liquid containing a functional-film material to an area for forming a functional film by an inkjet apparatus, the method including; the step of applying a coating by ejecting droplets of the functional liquid from plural nozzles to ejection areas for forming a functional film therein which are surrounded by bounded areas having a liquid repellent property, during a single scanning; wherein, in the step of applying the coating, when there is a non-ejectable nozzle out of plural nozzles to be used for applying a coating to a single ejection area, the amount of droplets of the functional liquid ejected from another ejectable nozzle to be used for applying a coating to this ejection area is made larger than that of cases where there is no non-ejectable nozzle. With the functional-film fabricating method having the aforementioned structure according to the first aspect, it is possible to form a uniform functional film, without degrading the productivity, even in the event of occurrence of non-ejectable nozzles, out of nozzles in an ink jet apparatus.

According to a second aspect of the present invention, there is provided the functional-film fabricating method according to the first aspect, wherein, in ejecting the functional liquid from nozzles to the ejection areas, when there is a non-ejectable nozzle out of plural nozzles to be used for applying a coating to a single ejection area, the functional liquid ejected from another ejectable nozzle to be used for applying a coating to this single ejection area is increased in amount of droplets, according to the number of non-ejectable nozzles. With the functional-film fabricating method having the aforementioned structure according to the second aspect, it is possible to certainly form a uniform functional film, even in the event of occurrence of non-ejectable nozzles, out of the nozzles in the ink jet apparatus.

According to a third aspect of the present invention, there is provided the functional-film fabricating method according to the first aspect, wherein the ejection areas are constituted by row areas defined by being sandwiched between parallel two or more line-shaped banks, the ink jet apparatus includes an ink jet-head having nozzles arranged in the shape of rows with a predetermined pitch, and, in ejecting the functional liquid from the nozzles to the row areas defined by the line-shaped banks for applying a coating to the ejection areas while relatively moving the ink jet head in the direction of scanning orthogonal to the longitudinal direction of the line-shaped banks, when some of the nozzles are non-ejectable nozzles, an ejectable nozzle near the non-ejectable nozzles is caused to apply a coating of the functional liquid, with an amount of droplets of the functional liquid corresponding to the number of non-ejectable nozzles, during a single scanning. With the functional-film fabricating method having the aforementioned structure according to the third aspect, it is possible to certainly form a uniform functional film, without degrading the productivity, even in the event of occurrence of continuous two or more non-ejectable nozzles, out of the nozzles in the ink jet apparatus.

According to a fourth aspect of the present invention, there is provided the functional-film fabricating method according to the first aspect, wherein, when there are continuous three or more non-ejectable nozzles, out of the nozzles, an ejectable nozzle adjacent to the non-ejectable nozzles at the opposite ends, out of the continuous non-ejectable nozzles, can be caused to apply a coating of the functional liquid, with an amount of droplets of the functional liquid corresponding to the number of the continuous non-ejectable nozzles.

According to a fifth aspect of the present invention, there is provided the functional-film fabricating method according to the third aspect, wherein the row areas defined by the line-shaped banks include plural pixel areas placed at constant intervals, and when some of the nozzles are non-ejectable nozzles, an ejectable nozzle having a droplet accretion position within an area between the pixel areas can be caused to apply a coating of the functional liquid, with an amount of droplets of the functional liquid corresponding to the number of non-ejectable nozzles.

According to a sixth aspect of the present invention, there is provided the functional-film fabricating method according to the fifth aspect, wherein the line-shaped banks can be formed such that wall portions thereof facing to the areas between the pixel areas have a height larger than that of wall portions thereof facing to the pixel areas.

According to a seventh aspect of the present invention, there is provided the functional-film fabricating method according to the third aspect, wherein the row areas defined by the line-shaped banks include plural pixel areas placed at constant intervals, when some of the nozzles are non-ejectable nozzles, and when the droplet accretion positions of these non-ejectable nozzles are in the pixel areas, an ejectable nozzle having a droplet accretion position within an area between pixel areas can be caused to apply a coating of the functional liquid, with an amount of droplets of the functional liquid corresponding to the number of non-ejectable nozzles, and when these non-ejectable nozzles exist in the areas between pixel areas, an ejectable nozzle near these non-ejectable nozzles can be caused to apply a coating of the functional liquid, with an amount of droplets of the functional liquid corresponding to the number of non-ejectable nozzles.

According to an eighth aspect of the present invention, there is provided the functional-film fabricating method according to the seventh aspect, wherein the line-shaped banks can be formed such that wall portions thereof facing to the areas between the pixel areas have a height larger than that of wall portions thereof facing to the pixel areas.

According to a ninth aspect of the present invention, there is provided the functional-film fabricating method according to the first aspect, wherein, when some of the nozzles are non-ejectable nozzles, the ejection frequency at which ejectable nozzles apply a coating of the functional liquid for complementing for the non-ejectable nozzles can be set to equal to or more than twice the ejection frequency before the complementing.

According to a tenth aspect of the present invention, there is provided the functional-film fabricating method according to the first aspect, wherein, when some of the nozzles are non-ejectable nozzles, an ejectable nozzle can be caused to apply a coating, by increasing the number of droplets from the ejectable nozzle by the same number as the number of the non-ejectable nozzles.

According to an eleventh aspect of the present invention, there is provided the functional-film fabricating method according to the first aspect, wherein the functional film can be an organic light-emitting layer in an organic electro-luminescence display.

According to a twelfth aspect of the present invention, there is provided the functional-film fabricating method according to the first aspect, wherein the bounded areas can be constituted by lattice-shaped banks which surround at least a single pixel area, the ink jet apparatus can includes an ink jet head including nozzles arranged in the shape of rows with a predetermined pitch, and, in ejecting the functional liquid from the nozzles during a single scanning of the ink jet head with respect to the lattice-shaped banks for applying a coating to the ejection areas, when there is a non-ejectable nozzle out of plural nozzles to be used for applying a coating to a single ejection area, the amount of droplets of the functional liquid ejected from another ejectable nozzle to be used for applying a coating to this single ejection area can be set to an amount of droplets corresponding to the number of non-ejectable nozzles.

According to the present invention, it is possible to ensure excellent uniformity of functional films, which enables provision of an electronic apparatus having a high-quality display which exhibits no luminance ununiformity.

BRIEF DESCRIPTION OF THE DRAWINGS

FIG. 3 is a view illustrating the positional relationship between the substrate and ink jet heads in an ink jet apparatus for use in the method for fabricating an organic electro-luminescence display according to the first embodiment;

FIG. 10 is a side cross-sectional view illustrating the shape of a bank, in a method for fabricating an organic electro-luminescence display according to a second embodiment of the present invention;

FIG. 11 is a plan view illustrating, in an enlarging manner, a portion of a substrate to be coated with ink containing an organic light-emitting material, in a method for fabricating an organic electro-luminescence display according to a third embodiment of the present invention;

FIG. 12 is a view illustrating the positional relationship between the substrate and an ink jet head in an ink jet apparatus, and an ink applying method to the substrate, according to the method for fabricating an organic electro-luminescence display according to the third embodiment of the present invention;

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

Hereinafter, there will be described functional-film fabricating methods according to preferred embodiments of the present invention. Further, in the following description, there will be described, as examples, methods for fabricating an organic electro-luminescence display (hereinafter, abbreviated as an organic EL display) including an organic light-emitting layer as a functional film, with reference to the accompanying drawings. Further, the functional-film fabricating methods according to the present invention are not limited to methods for fabricating an organic EL display and are also applicable to displays of various types of electronic apparatuses, such as color filters in liquid crystal display devices.

First Embodiment

Figure 1:
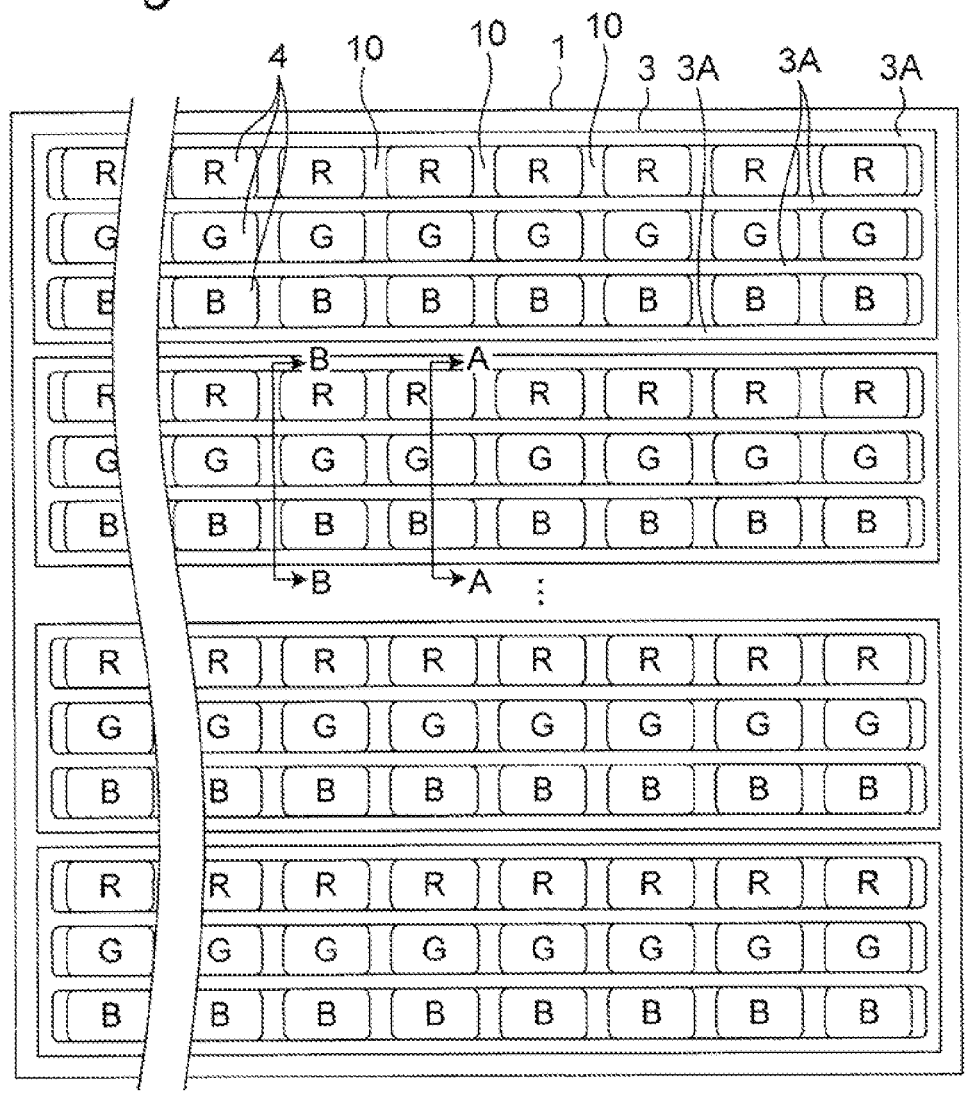
FIG. 1 is a plan view of a substrate which is to be coated with ink in a method for fabricating an organic electro-luminescence display according to a first embodiment of the present invention.
Figure 2A:
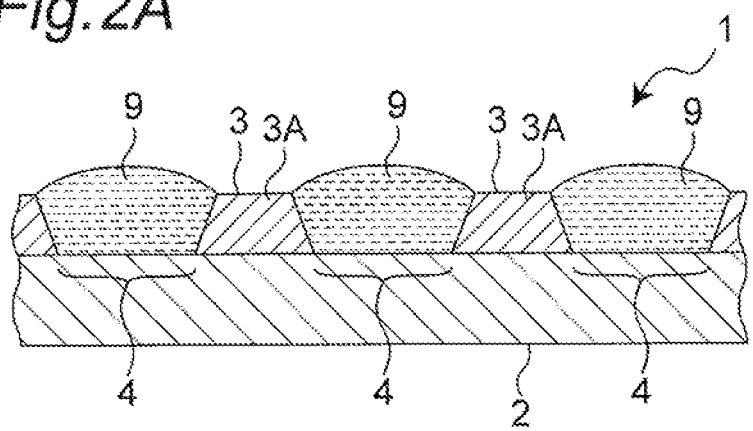
FIG. 2A is an enlarged cross-sectional view of the substrate in the method for fabricating an organic electro-luminescence display according to the first embodiment, and is a cross-sectional view of the substrate illustrated in FIG. 1 taken along the line A-A at a state immediately after applying a coating of RGB ink thereto.
Figure 2B:
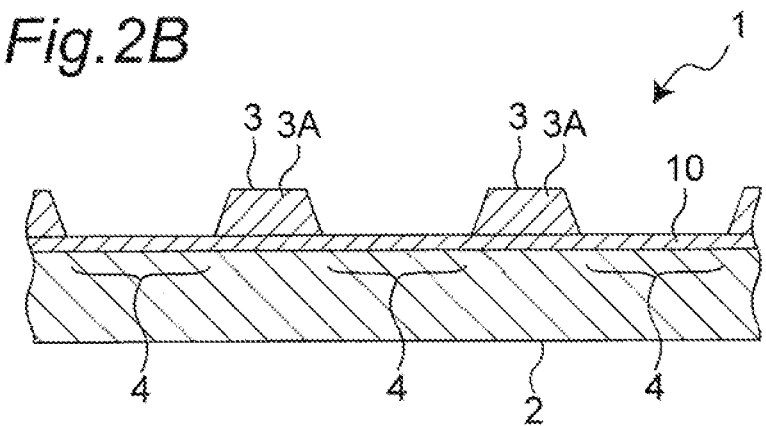
FIG. 2B is an enlarged cross-sectional view of the substrate in the method for fabricating an organic electro-luminescence display according to the first embodiment, and is a cross-sectional view of the substrate illustrated in FIG. 1 taken along the line B-B.

FIG. 1 is a plan view illustrating, from above, a substrate 1 which is to be coated with ink 9 containing an organic light-emitting material, in a method for fabricating an organic EL display according to a first embodiment. FIGS. 2A and 2B are enlarged cross-sectional views of the substrate 1 illustrated in FIG. 1. FIG. 2A is a cross-sectional view illustrating a cross section of the substrate 1 illustrated in FIG. 1 taken along the line A-A at a state immediately after applying a coating of RGB ink thereto, and FIG. 2B is a cross-sectional view of the substrate 1 illustrated in FIG. 1 taken along the line B-B.

As illustrated in FIGS. 1, 2A and 2B, the substrate 1 is provided with banks 3 for defining pixel areas 4 on a base substrate 2. The base substrate 2 on which the banks 3 are formed is provided with components necessary for an organic EL display, such as a reflection anode and a hole injection layer, which are not illustrated in FIGS. 2A and 2B. The banks 3 may have either a regular tapered cross-sectional shape as illustrated in FIGS. 2A and 2B or a counter tapered cross-sectional shape having a narrower lower end. As the material of the banks 3 according to the first embodiment, it is possible to arbitrarily employ any material having an electric insulation property, and it is preferable to employ a resin having an electric insulation property and having thermal resistance and resistance to solvents (for example, a polyimide resin). As the method for forming the banks 3, photolithography techniques and the like are employed, and they can be formed through patterning. For example, after applying a coating of the bank material, it is possible to perform baking processing, mask light-exposure processing, development processing and the like, in the mentioned order, to form desired shapes on the base substrate 2.

As illustrated in FIG. 2B, pixel restriction layers 10 are formed on the base substrate 2 in the substrate 1, and the banks 3 are formed on the pixel restriction layers 10. The pixel restriction layers 10 are formed from an inorganic material, such as SiON. The pixel restriction layers 10 are formed to extend in the shape of lines in the direction orthogonal to the line-shaped banks 3, and the plural parallel line-shaped banks 3 and the plural parallel line-shaped pixel restriction layers 10 are formed, such that they form a lattice shape when they are viewed from above the substrate 1.

The ink 9 is ejected to the areas which are defined and bounded by the banks 3 to apply a coating of the ink 9 thereto. The surfaces of the banks 3 which contact with the applied ink 9 have been subjected to fluorination processing using fluorine-based gas plasma and the like and, therefore, exhibit a liquid repellent property. The banks 3 have been subjected to the liquid repellent processing as described above and, therefore, even at a state where the ink 9 is bulged between the banks 3 after the pixel areas 4 are coated with the ink 9, as will be described later, the ink 9 can be certainly retained by the banks 3 and can be certainly contained between the banks 3. Further, on the surfaces which face to the base substrate 2 and form the pixel areas 4, there is formed a layer with a higher affinity for liquid than that of the aforementioned banks 3, which realizes a structure capable of certainly retaining the ink 9 in the pixel areas 4.

As illustrated in the plan view in FIG. 1, the banks 3 formed on the base substrate 2 include plural line-shaped banks 3A which are straightly extended (extended in the leftward and rightward directions in FIG. 1), and these line-shaped banks 3A are formed in parallel with one another. The row areas sandwiched between the respective line-shaped banks 3A are structured to include plural pixel areas 4 for R (red) G (green) and B (blue). Further, in the respective row areas for R, G and B, there are formed the aforementioned pixel restriction layers 10 in such a way as to define the respective pixel areas 4. The pixel restriction layers 10 are formed to have a thickness smaller than that of the banks 3. Namely, the pixel restriction layers 10 are formed to have a height from the base substrate 2 which is smaller than the height of the banks 3 from the base substrate 2. In the first embodiment, in the substrate 1, the height of the banks 3 from the base substrate 2 is about 1 micrometer, for example. The layer thickness of the pixel restriction layers 10 is about 100 nm (about 0.1 micrometer), for example. Accordingly, there is a structure which allows the liquid-type ink 9 ejected into the row areas surrounded by the banks 3 to freely move within the row areas beyond the pixel areas 4 defined by the pixel restriction layers 10. Namely, the amount of the ink 9 ejected into each row area is an amount which exceeds the layer thickness of the pixel restriction layers 10, which realizes a state where the liquid-type ink can move to and from different pixel areas 4 within the same row areas, during the ejection of the ink. Further, in the first embodiment, the plural line-shaped banks 3A are formed, such that the width between adjacent line-shaped banks 3A is 60 micrometers. The banks 3 for R, G and B which are formed as described above are repeatedly formed on the substrate 1.

FIG. 3 is a view illustrating the positional relationship between the substrate 1 illustrated in FIG. 1 and three ink jet heads 5R, 5G and 5B for R, C and B in an ink jet apparatus according to the first embodiment. The respective ink jet heads 5R, 5G and 5B are provided with plural nozzles 6 (see FIG. 4) for use for applying coatings of the respective inks 9 for R, G and B and, also, are placed such that the droplet accretion positions of the inks 9 (so-called shot accretion positions) are within the row areas surrounded by the bunks 3, during scanning operations which will be described later. The three ink jet heads 5R, 5G and 5B for R, G and B have the same structure and, therefore, will be described as being ink jet heads 5, in the following description. In FIG. 3, an arrow designated by a reference character X indicates the direction of scanning of the ink jet heads 5.

Further, while, in the first embodiment, the ink jet heads 5 have been described as being three ink jet heads 5R, 5G and 5B for R, G and B, it is also possible to employ a single ink jet head provided with nozzles for R, G and B.

Figure 4:
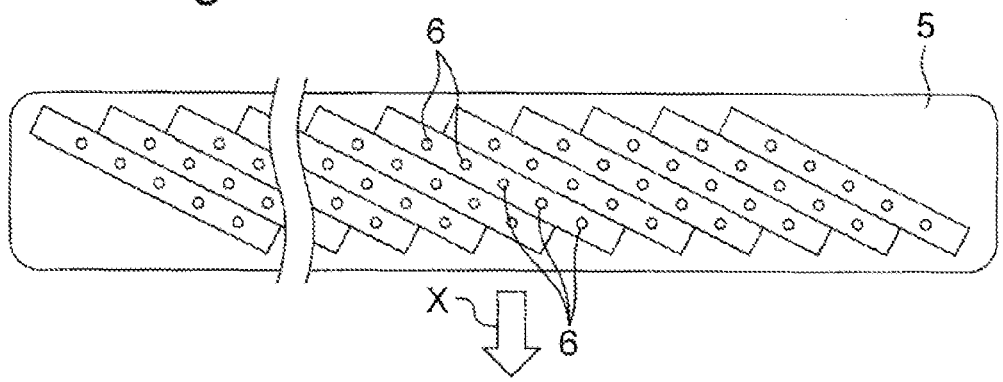
FIG. 4 is a view illustrating the placement of nozzles in the ink jet apparatus for use in the method for fabricating an organic electro-luminescence display according to the first embodiment.

FIG. 4 is a view conceptually illustrating an example of the surface of an ink jet head 5 (5R, 5G, 5B) which has plural nozzles 6 and faces to the substrate. As illustrated in FIG. 4, in the ink jet head 5, the plural nozzles 6 are formed on the surface thereof which faces to the substrate 1. In the ink jet head 5, rows of plural nozzles 6 placed in a line shape are placed obliquely with respect to the direction of scanning over the substrate 1 (the direction of the arrow X in FIG. 4), and these rows of plural nozzles 6 are placed in parallel with one another along plural rows. In the ink jet head 5, the rows of plural nozzles 6 placed in a line shape are placed obliquely with respect to the direction of scanning, in order to make the pitch of the nozzles 6 smaller, for example, about 20 micrometers, such that droplets of the ink 9 ejected from the nozzles 6 are coupled with one another at the droplet accretion positions, during applying a coating of the ink 9 to the row areas surrounded by the bunks 3. Since the rows of plural nozzles 6 are placed at a desired angle such that they are oblique with respect to the direction of scanning, as described above, it is possible to set the nozzle pitch interval at a desired small distance. This can realize a structure which enables applying a coating of the ink 9 to a single pixel area 4 through the plural nozzles 6. In FIG. 4, the number of the nozzles 6 and the intervals between the nozzles 6, the angle of the rows of nozzles and the like are conceptually illustrated, for ease of description.

Figure 5:
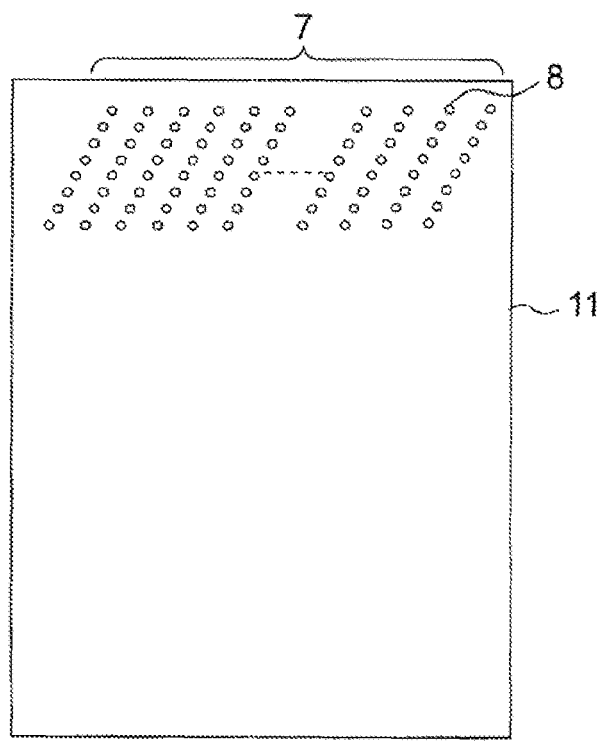
FIG. 5 is a view illustrating check patterns for use in the method for fabricating an organic electro-luminescence display according to the first embodiment.

FIG. 5 is a view illustrating a substrate 1 (for example, a glass substrate) on which check patterns 7 have been formed for checking the ejection/non-ejection states of the nozzles 6. The ejection/non-ejection states of the nozzles 6 are checked, before ink ejection operations by the ink jet head 5. Ink droplets 8 are ejected to droplet check areas provided on the substrate 1 from the respective nozzles 6 with a pitch which prevents these ink droplets 8 from coupling with one another, in such a way as to form the check patterns 7 illustrated in FIG. 5. Thereafter, the check patterns formed by the ejected ink droplets 8 are subjected to image pickup with a recognition camera, and the image is processed, in order to check whether or not the ink droplets 8 were ejected to predetermined positions.

Further, the droplet check areas in which the check patterns 7 are formed are preferably formed at a portion of a display substrate to be coated with RGB inks, but can be formed on a substrate dedicated for droplet checking.

As described above, the ejection/non-ejection states of the nozzles 6 are checked, and based on the ejection/non-ejection states, complemented coating data for this ink jet head 5 is created.

Figure 6A:
FIG. 6A is a view illustrating a case where all the nozzles perform ejection in the method for fabricating an organic electro-luminescence display according to the first embodiment.
Figure 6B:
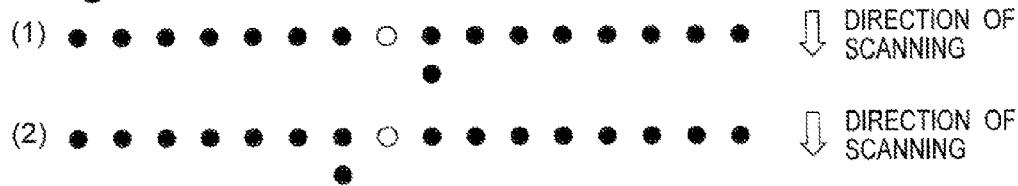
FIG. 6B is a view illustrating a case where some of the nozzles are non-ejectable nozzles in the method for fabricating an organic electro-luminescence display according to the first embodiment.
Figure 6C:
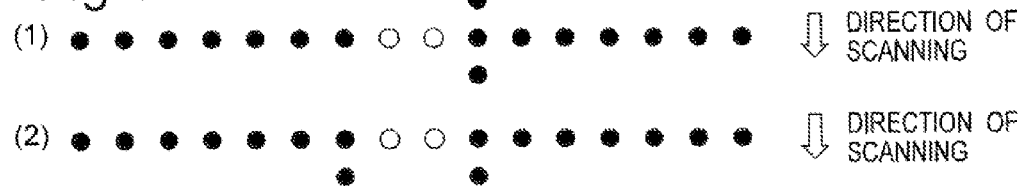
FIG. 6C is a view illustrating a case where some of the nozzles are non-ejectable nozzles in the method for fabricating an organic electro-luminescence display according to the first embodiment.
Figure 6D:
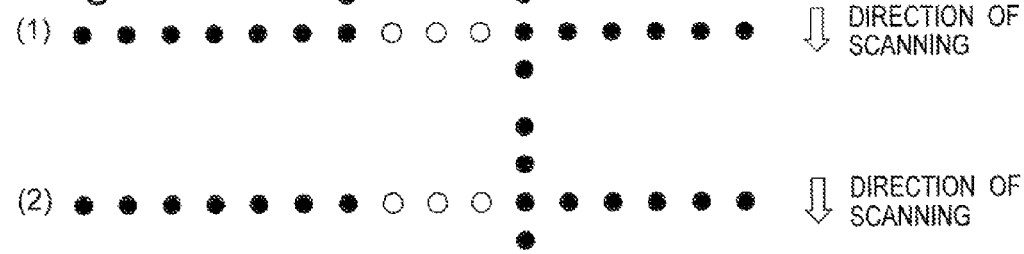
FIG. 6D is a view illustrating a case where some of the nozzles are non-ejectable nozzles in the method for fabricating an organic electro-luminescence display according to the first embodiment.

FIGS. 6A to 6D are views illustrating various types of ejection states of ink 9 ejected from the plural nozzles 6 in a single row of nozzles in an ink jet head 5, wherein the up-to-down directions in FIGS. 6A to 6D are the direction of scanning of the ink jet head 5. FIG. 6A illustrates a case where all the nozzles perform ejection, and FIGS. 6B to 6D illustrate cases where some of the nozzles are non-ejectable nozzles. FIGS. 6B to 6D illustrate complementing methods in cases where there are non-ejectable nozzles. In FIGS. 6A to 6D, white circles indicate areas to be subjected to coating with non-ejectable nozzles, and black circles indicate areas which have been coated with ejectable nozzles.

(1) and (2) in FIG. 6B illustrate a complementing method in cases where only a single nozzle is not capable of ejection. (1) and (2) in FIG. 6C illustrate a complementing method in cases where continuous two nozzles are not capable of ejection. (1) and (2) in FIG. 6D illustrate a complementing method in cases where continuous three nozzles are not capable of ejection.

Hereinafter, the complementing methods performed in the method for fabricating an organic EL display according to the first embodiment will be described, in detail.

In order to check the ejection/non-election states of the respective nozzles 6 in the ink jet head 5, ink 9 is applied to the substrate 1 (for example, a glass substrate) from the respective nozzles 6 in this ink jet head 5 to form, thereon, the check patterns 7 illustrated in FIG. 5.

In the method for applying a coating to the substrate 1 using an ink jet head 5, ink is ejected from the respective nozzles 6 while the ink jet head 5 is scanned over the substrate 1. At this time, the direction of scanning is the same as the direction orthogonal to the line-shaped banks 3A on the substrate 1, as illustrated in FIG. 3. In ejection/non-ejection checking operations, the ink jet heads 5 (5R, 5G and 5B) are caused to perform provisional coating operations for the substrate 1, on the assumption that predetermined ink 9 is ejected from the nozzles 6 to the respective row areas for R, G and B.

After a coating of the ink 9 is applied to the substrate 1 from the respective nozzles 6 in the ink jet heads 5 to form the check patterns 7, the ejection states of the respective nozzles 6 are checked from the check patterns 7 on the substrate 1. If there is induced a non-ejectable nozzle, coating data is created such that complementing operations are performed using an ejectable nozzle near the non-ejectable nozzle. The complementing method is varied according to the number of continuous non-ejectable nozzles, as illustrated in FIGS. 6B to 6D.

In cases where there is induced only a single non-ejectable nozzle, as illustrated in (1) and (2) in FIG. 6B, complemented coating data is created such that, during a single scanning, a single ejectable nozzle which is leftwardly or rightwardly adjacent to the non-ejectable nozzle is caused to apply a coating of the ink 9 with a doubled amount of droplets of the ink 9, namely two droplets of the ink 9.

In cases where there are induced continuous two non-ejectable nozzles, as illustrated in FIG. 6C, complemented coating data is created such that, during a single scanning, an ejectable nozzle adjacent to the left or right one of these continuous non-ejectable nozzles is caused to apply a coating of the ink 9 with a tripled amount of droplets of the ink 9, namely three droplets of the ink 9, as illustrated in (1) in FIG. 6C. Also, as illustrated in (2) in FIG. 6C, complemented coating data is created such that, during a single scanning, ejectable nozzles adjacent to both the left and right nozzles out of these continuous non-ejectable nozzles are both caused to apply a coating of the ink 9 with a doubled amount of droplets of the ink 9, namely two droplets of the ink 9.

Further, in cases where there are induced continuous three non-ejectable nozzles, as illustrated in FIG. 6D, complemented coating data is created such that, during a single scanning, an ejection nozzle adjacent to the left-end one or the right-end one of these continuous three non-ejectable nozzles is caused to apply a coating of the ink 9 with a doubled amount of droplets of the ink 9, namely two droplets of the ink 9 and, also, an ejectable nozzle at the other side is caused to apply a coating of the ink 9 with a tripled amount of droplets of the ink 9, namely three droplets of the ink 9, as illustrated in (1) in FIG. 6D. Also, as illustrated in (2) in FIG. 6D, complemented coating data is created such that, during a single scanning, an ejectable nozzle adjacent to the left-end one or the right-end one of the three continuous non-ejectable nozzles is caused to apply a coating of the ink 9 with a quadrupled amount of droplets of the ink 9, namely four droplets of the ink 9.

As described above, ink 9 is ejected from the plural nozzles 6 to the substrate 1 having the plural row areas defined by the banks 3. In cases where there is no non-ejectable nozzle or during normal operations before complementing processing, the ejection frequency at which the nozzles 6 eject ink 9 is set to 10 kHz, in the first embodiment. On the other hand, in cases where there is observed a non-ejectable nozzle and, thus, complementing processing is performed, ink 9 is ejected to the corresponding row areas in the substrate 1 at an ejection frequency of 20 kHz, which is twice the ejection frequency of normal cases.

Further, in the first embodiment, the ejectable nozzles eject the same amount of droplets of ink 9, and this amount of droplets can be converted into a number of droplets. Further, in the first embodiment, each nozzle 6 ejects droplets of ink 9 in an amount of 5 pl (picoliters).

As described above, the ink jet apparatus according to the first embodiment of the present invention is adapted to eject ink 9 from the plural nozzles 6 to the row areas which are bounded and defined substantially in the shape of lines by the banks 3 constituted by the plural parallel line-shaped banks 3A formed on the substrate 1. Accordingly, the ink jet apparatus is structured such that an amount of droplets of ink 9 which corresponds to the number of induced non-ejectable nozzles is ejected to the corresponding row areas from ejectable nozzles adjacent to the non-ejectable nozzles, during a single scanning operation. As described above, the ink jet apparatus according to the first embodiment is capable of completing complementing processing during a single scanning operation and, thus, is capable of performing the complementing processing while the ink 9 has not yet been dried. Therefore, with the organic-EL-display fabricating method according to the first embodiment, it is possible to allow the ink 9 applied to the row areas to flow, which advances leveling, thereby certainly attaining uniformization of the organic light-emitting layer which forms the organic light-emitting film in the respective pixel areas for R, G and B. Further, while, in the first embodiment, in cases where there is induced a non-ejectable nozzle, an ejectable nozzle adjacent to this non-ejectable nozzle is caused to eject ink 9 to the corresponding row area, in the present invention, it is also possible to utilize any nozzle 6 capable of ejecting ink 9 to the corresponding row area, other than a nozzle adjacent to the non-ejectable nozzle. This is because ink 9 can flow within the row areas to attain leveling. However, preferable coating operations include complementing processing utilizing an ejectable nozzle near a non-ejectable nozzle.

Regarding the speed of coating through the nozzles 6, in the ink jet apparatus according to the first embodiment, the value of DPI (dot per inch) is 4800 dpi in the direction of scanning and, therefore, in cases of performing complementing, the intervals of the complemented coating positions have a length of 5.291667 micrometers in the direction of scanning. The coating processing for the substrate 1 using the ink jet apparatus, including complementing operations, is adapted to be completed during a single scanning operation. The order of applying coatings of R, G and B inks 9 is not particularly limited, but in the first embodiment, coatings of R, G and B are performed in the mentioned order. Further, the thickness of the organic light-emitting layer which forms an organic light-emitting film for R, G and B, which is formed after the application of the coating, is preferably about 50 to 100 nm (for example, 70 ma).

In the ink jet apparatus according to the first embodiment, the organic light-emitting material contained in the ink 9 is preferably a polymer-based light-emitting material. Exemplary polymer-based light-emitting materials include Poly phenylene vinylene (PPV) and derivatives thereof, Poly acetylene and derivatives thereof, Polyphenylene and derivatives thereof, Poly para phenyleneethylene and derivatives thereof, Poly 3-hexyl thiophene (P3HT) and derivatives thereof, and Poly fluorene (PF) and derivatives thereof. Further, the viscosity of the ink is set to about 10 mPa·s.

Figure 7A:
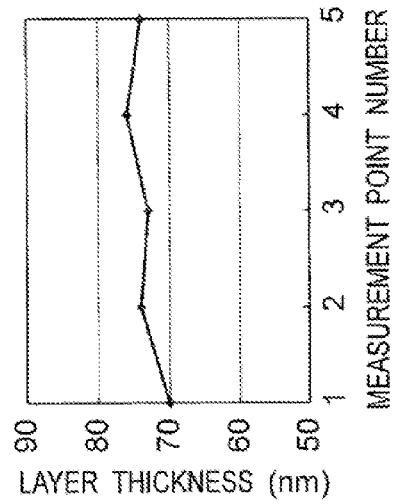
FIG. 7A is a graph illustrating the results of measurements of the layer thicknesses of an organic light-emitting layer which was formed in a case where there was no non-ejectable nozzle.
Figure 7B:
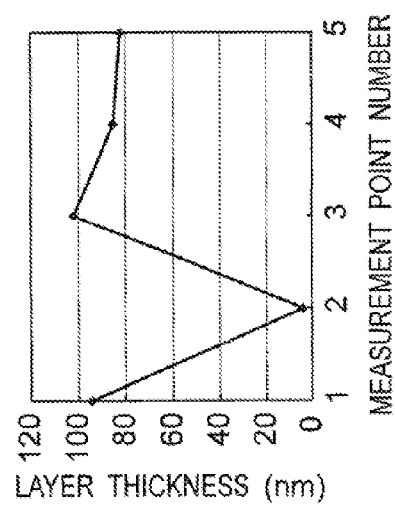
FIG. 7B is a graph illustrating the results of measurements of the layer thicknesses of an organic light-emitting layer which was formed without performing complementing processing, in a case where there were continuous three non-ejectable nozzles.
Figure 7C:
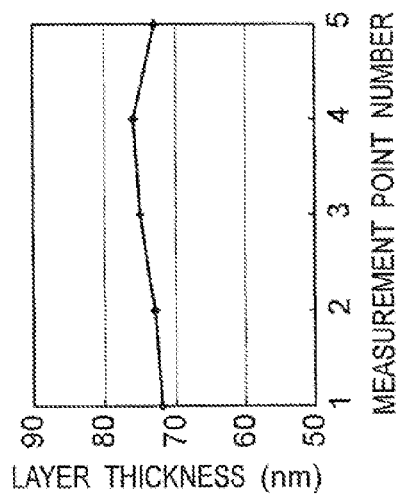
FIG. 7C is a graph illustrating the results of measurements of the layer thicknesses of organic light-emitting layers, wherein the organic light-emitting layers was formed by actually performing coating processing, in the method for fabricating an organic electro-luminescence display according to the first embodiment.

FIGS. 7A to 7C show graphs illustrating the results of measurements of the layer thicknesses of organic light-emitting layers, wherein the organic light-emitting layers were formed as organic light-emitting films by actually performing coating processing. After the coating processing, vacuum drying was performed to form the organic light-emitting layers, and the layer thicknesses thereof were measured. As conditions for drying, after the application of the coating, the layers were let stand for 1 minute and, thereafter, were introduced into a drying oven, then a vacuum was produced up to 1 Pa for 5 minutes, and, then, the layers were dried for 20 minutes at a state where the temperature was kept at 40 degrees C. and the vacuum was kept at 1 Pa.

FIG. 7A illustrates the results of measurements of the layer thickness of an organic light-emitting layer which was formed in a case where there was no non-ejectable nozzle. FIG. 7B illustrates the results of measurements of the layer thickness of an organic light-emitting layer which was formed without performing complementing processing, in a case where there were continuous three non-ejectable nozzles. FIG. 7C illustrates the results of measurements of the layer thickness of an organic light-emitting layer, wherein the organic light-emitting layer was formed as an organic light-emitting film by performing coating processing including the aforementioned complementing processing, in a case where there were continuous three non-ejectable nozzles.

The results of the layer-thickness measurements illustrated in FIGS. 7A to 7C shows, regarding the average layer thicknesses and the uniformities of the organic light-emitting layers, that, in the case where there was no non-ejectable nozzle and all the nozzles were caused to perform ejection, as illustrated in FIG. 7A, the average layer thickness was 73.8 nm and the variation was 5.4%. In the case where there were continuous three non-ejectiable nozzles as illustrated in FIG. 78, the average layer thickness was 71.4 nm and the variation was 140%. Further, as illustrated in FIG. 7C, in the case where there were continuous three non-ejectable nozzles, and the coating operation including the complementing processing was performed, the average layer thickness was 73.4 nm and the variation was 7.5%. As illustrated in FIG. 7C, the variation was largely reduced through the complementing processing, because the respective row areas for R, G and B were formed by the banks 3 on the substrate 1 to be coated with the ink 9, and these row areas were structured to be coated with the ink 9. It can be considered that, immediately after applying the coating of the ink to the row areas, the ink had flowability and, therefore, the ink 9 moved within the row areas to attain excellent uniformity (leveling). Further, as illustrated in FIG. 7B, in the case where there were continuous three non-ejectable nozzles, there was a significantly large variation. This was because the overall amount of droplets was smaller due to the existence of the non-ejectable nozzles, and a portion of the liquid was separated to induce areas in which no liquid (the ink 9) existed. The aforementioned variation indicating the layer-thickness uniformity was calculated, according to "{(the maximum layer-thickness value)−(the minimum layer-thickness value)}/(the average layer-thickness value)× 100[%]".

Figure 8:
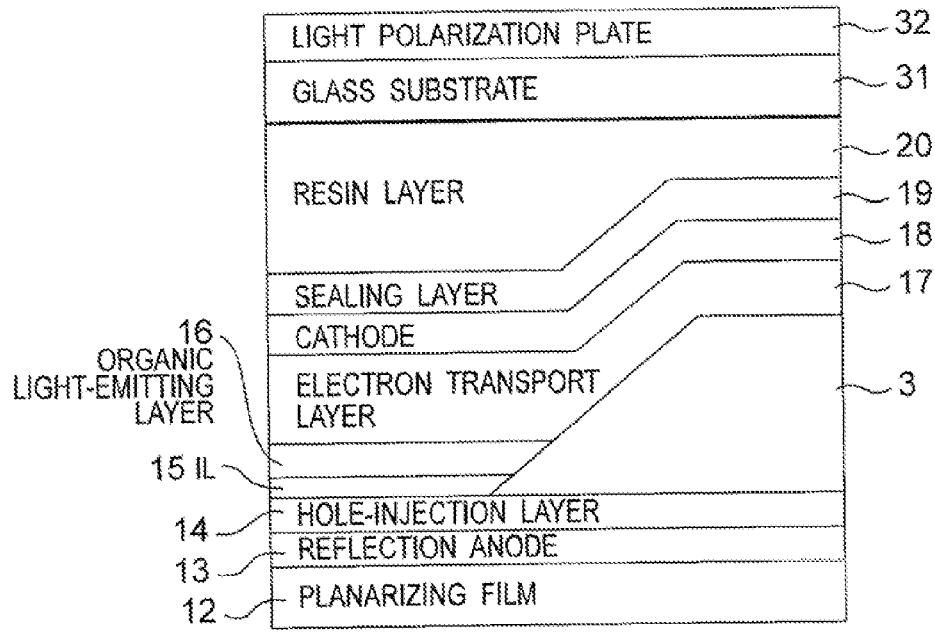
FIG. 8 is a cross-sectional view illustrating the general layer structure of an organic EL display having an organic light-emitting layer formed using the ink jet apparatus, according to the method for fabricating an organic electro-luminescence display according to the first embodiment.

FIG. 8 is a cross-sectional view illustrating, in detail, an example of an organic EL display having an, organic light-emitting layer as an organic light-emitting film formed using the ink jet apparatus according to the first embodiment, illustrating the general outline of the layer structure of the organic EL display. The relative layer thicknesses and the shapes of the respective layers illustrated in FIG. 8 are not intended to indicate the actual layer thicknesses and shapes and are illustrated for ease of description. The organic EL display illustrated in FIG. 8 includes a planarizing film 12 on a base substrate, a reflection anode 13 and a hole injection layer 14 which are formed on the planarizing film 12, and pixel restriction layers 10 (not illustrated in FIG. 8) and banks 3 as described above which are formed on the hole injection layer 14. In the row areas bounded by the banks 3 formed as described above, there is formed an inter layer (an IL) 15 having the function of blocking the flow of electrons into the reflection anode, and, further, there is formed an organic light-emitting layer 16 formed as described above.

The reflection anode 13 is formed to be partitioned in association with the respective plural pixel areas 4 illustrated in FIG. 1 and forms light emitting portions in the display. Also, after the deposition of the pixel restriction layers 10, the hole injection layer 14 can be deposited over the entire surface and, thereafter, the banks 3 can be formed. The pixel restriction layers 10 can be formed through normal photolithography techniques. Namely, the pixel electrode layers 10 can be formed through formation steps for resist coating processing, mask light-exposure processing, development processing, dry etching processing and resist removing processing, in the mentioned order.

Further, the ink jet apparatus according to the first embodiment is used for the coating processing for forming the organic light-emitting layer 16 and, also, an ink jet apparatus having the same structure is used for the coating processing for forming the inter layer (IL) 15.

As illustrated in FIG. 8, in the organic EL display, there are formed an electron transport layer 17, a cathode 18 and a sealing layer 19 and a resin layer 20 such that they are overlaid on the organic light-emitting layer 16 and the banks 3. Further, a glass substrate 31, a light polarization plate 32 and the like are provided on the resin layer 20 to structure the organic EL display.

Figure 9:
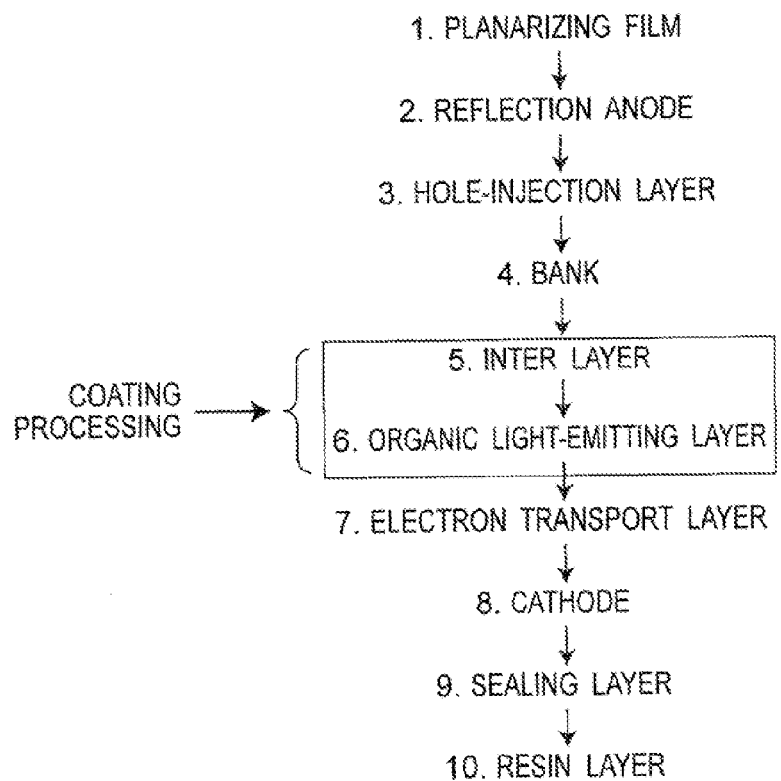
FIG. 9 is a flow chart illustrating processing in the method for fabricating an organic electro-luminescence display according to the first embodiment.
Figure 13A:
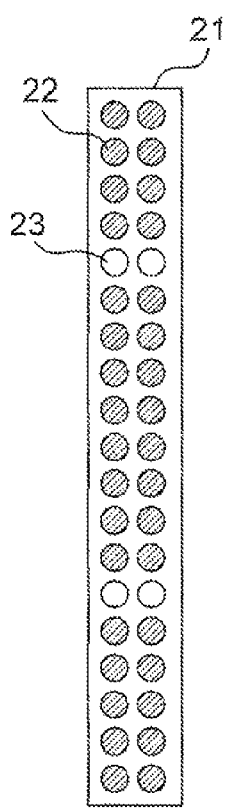
FIG. 13A is the view illustrating the placement of the ejectable nozzles and non-ejectable nozzles in the conventional method.
Figure 13B:
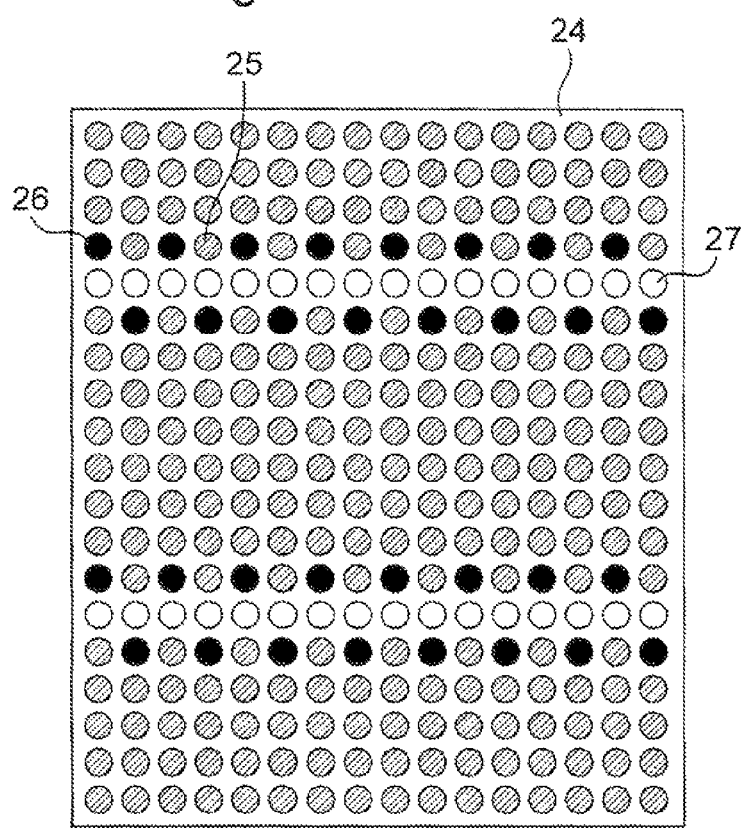
FIG. 13B is the view illustrating the result of recording on the recording sheet using the ink jet head in the conventional method.

The organic EL display having the aforementioned structure is fabricated as illustrated in a processing flow chart in FIG. 9. Namely, the organic EL display is fabricated by performing formation of a planarization film, formation of a reflection anode, formation of a hole injection layer, formation of banks, formation of an IL, formation of an organic light-emitting layer, formation of an electron transport layer, formation of a cathode, formation of a sealing layer and formation of a resin layer, in the mentioned order. In this fabrication processing, the organic light-emitting layer and the IL are formed by applying coatings of predetermined materials using the ink jet apparatus described in the first embodiment.

As described above, in the method for fabricating an organic EL display according to the first embodiment, the ink jet apparatus is used for the processing for forming an organic light-emitting layer, an IL and the like. In the event of occurrence of non-ejectable nozzles, for a substrate 1 having row areas for R, G and B which are defined in the shape of lines by banks 3 having plural parallel line-shaped banks 3A, the ink jet apparatus is adapted to apply a coating to the row areas bounded by the same line-shaped banks 3A, by increasing the number of droplets from ejectable nozzles adjacent to the non-ejectable nozzles by the same number as the number of the non-ejectable nozzles, during a single scanning. Accordingly, the ink jet apparatus according to the first embodiment is capable of uniformly forming predetermined functional films within predetermined row areas on a substrate, without degrading the productivity. With the method for fabricating an organic EL display according to the first embodiment, it is possible to ensure excellent uniformity of the layer thicknesses of organic light-emitting layers and the like as functional films, thereby providing a high-quality organic EL display which exhibits no luminance ununiformity.

Second Embodiment

Hereinafter, there will be described a method for fabricating an organic EL display according to a second embodiment of the present invention, with reference to the accompanying drawings.

The organic-EL-display fabricating method according to the second embodiment is different from the organic-EL-display fabricating method according to the first embodiment, in the shape of line-shaped banks in banks formed on a substrate. Accordingly, in the description of the second embodiment, components having the same structures as those described in the first embodiment will be designated by the same reference characters and will not be described in the second embodiment, in such a way as to incorporate the description in the first embodiment.

FIG. 10 is a side view of a line-shaped bank 30A formed on a base substrate 2. The line-shaped bank 30A illustrated in FIG. 10 is illustrated in a side view in the direction of scanning of ink jet heads. FIG. 10 is a side view of a cross section thereof which is orthogonal to the cross section of the line-shaped banks 3A illustrated in FIG. 1 in the first embodiment.

As illustrated in FIG. 10, in the line-shaped bank 30A, a second bank portion 30b which is a wall portion facing to the area between adjacent pixel areas 4 (hereinafter, referred to as a pixel-area interval area) has a height larger than the height of a first bank portion 30a which is a wall portion facing to a pixel area 4. In this case, the pixel-area interval area refers to an area between a pixel area 4 for R and a pixel area 4 for R adjacent thereto.

In the second embodiment, the height of the first bank portion 30a for the pixel area 4 is 1 micrometer (1000 nm), while the height of the second bank portion 30b for the pixel-area interval area is 1.5 micrometer (1500 nm), which is 1.5 times the height of the first bank portion.

As a method for forming such line-shaped banks 30A, photolithography techniques are used, and they are formed through pattering. For example, at first, base bank portions which form first bank portions 30a are formed and, then, portions which form the upper portions of second bank portions 30b are formed on the base bank portions. More specifically, after applying a coating of the bank material, it is possible to perform baking processing, mask light-exposure processing, development processing and the like, in the mentioned order, to form the base bank portions which form the first bank portions 30a. Next, in order to form the second bank portions 30b, it is possible to perform the same formation steps to form the upper portions of the second bank portions 30b on the first bank portions 30a.

The organic EL display and the ink jet apparatus according to the second embodiment have the same structures as those of the aforementioned first embodiment. Accordingly, hereinafter, the second embodiment will be described with reference to FIG. 1, FIG. 3 and FIG. 4 and FIG. 5 used for the description of the aforementioned first embodiment. Further, the positional relationship between the substrate 1 and the nozzles 6 in the ink jet heads 5 (5R, 5G and 5B) in the ink jet apparatus and the direction of scanning thereof are also the same as those of the aforementioned first embodiment.

In the organic-EL-display fabricating method according to the second embodiment, in order to check the non-ejection states of the nozzles 6, ink 9 is applied to a substrate 1 (for example, a glass substrate) to form check patterns 7 (see FIG. 5) thereon. The method for applying the coating is the same as the coating method described in the aforementioned first embodiment and, as illustrated in FIG. 3, the nozzles 6 are caused to eject the ink 9 successively at a predetermined frequency, while the ink jet heads 5 are moved in the direction of scanning (the direction X in FIG. 3) with respect to the substrate 1. After the ink 9 has been applied thereto through the respective nozzles 6 in the ink jet heads 5 to form the check patterns 7 on the substrate 1, the check patterns are subjected to image pickup with a camera, and the image is processed, in order to check the ejection states of the respective nozzles 6.

In checking operations on the check patterns 7 on the substrate 1, if a non-ejectable nozzle is found, the state of occurrence of non-ejectable nozzles, the number of non-ejectable nozzles and the number of continuous non-ejectable nozzles are detected. Based on the result of the detection, coating data is created for performing complemented coating processing. In the coating data, the amount of droplets from ejectable nozzles near the non-ejectable nozzles is increased. The degree of the increase of the amount is determined according to the state of occurrence of non-ejectable nozzles and is determined according to the number of non-ejectable nozzles and the like.

In complementing operations with the ink jet apparatus according to the second embodiment, if the droplet accretion position of the ink 9 to be applied from a non-ejectable nozzle is within a pixel area 4, complementing is performed using an ejectable nozzle having a droplet accretion position of the ink 9 within a pixel-area interval area. For example, complementing is performed, using an ejectable nozzle having a droplet accretion position within a pixel-area interval area at a position closest to the area to be coated with the non-ejectable nozzle.

Further, if the droplet accretion position of the ink 9 to be applied from a non-ejectable nozzle is within a pixel-area interval area, complementing is performed according to the coating method described in the aforementioned first embodiment. Namely, as illustrated in FIGS. 6B, 6C and 6D, the amount of droplets from an ejectable nozzle adjacent to the non-ejectable nozzle is increased by a predetermined amount of droplets according to the number of continuous non-ejectable nozzles.

With the ink jet apparatus according to the second embodiment, in cases where a non-ejectable nozzle exists within a pixel area 4 as described above, complementing is performed using an ejectable nozzle existing in a pixel-area interval area. Experiments were conducted for making a comparison between complementing for continuous three non-ejectable nozzles through this coating processing and complementing for three non-ejectable nozzles through the coating processing according to the first embodiment. The experiments revealed that, as a result of the complementing according to the second embodiment, the variation indicative of the layer-thickness uniformity was 12%, while the complementing according to the first embodiment resulted in a variation of 7.5%.

As described above, the complementing method according to the second embodiment is slightly inferior to the complementing method according to the first embodiment, in terms of uniformity, in cases where there are continuous three non-ejectable nozzles. Even though the amount of droplets from an ejectable nozzle at a complementing position within a pixel-area interval area is increased, the second bank portions 30b of the line-shaped banks 30A which face to the pixel-area interval areas have a height larger than that of the first bank portions 30a facing to the pixel areas 4, which certainly prevents mixture of the colors R, G and B.

As described above, with the method for fabricating an organic EL display according to the second embodiment, in the event of occurrence of non-ejectable nozzles, for a substrate 1 having row areas for R, G and B which are defined by parallel line-shaped banks 30A, ejectable nozzles near the non-ejectable nozzles are caused to apply a coating to the corresponding row areas, by increasing the number of droplets from these ejectable nozzles by the same number as the number of the non-ejectable nozzles, during a single scanning. This enables certainly forming a coating film without inducing mixture of colors and without degrading the productivity. As described above, with the method for fabricating an organic EL display according to the second embodiment, it is possible to form an organic light-emitting layer and the like without inducing mixture of colors, while ensuring excellent uniformity of the layer thickness. This enables provision of a high-quality organic EL display which exhibits no luminance ununiformity.

The organic-EL-display fabricating method according to the second embodiment has been described with respect to a structure having second bank portions 30b for pixel-area interval areas which have a height larger than that of first bank portions 30a for pixel areas 4. However, even in cases where the height of the bank portions for the pixel-area interval areas is not larger, and the line-shaped banks 30A have the same height, it is also possible to perform complementing using ejectable nozzles 6 in pixel-area interval areas to reduce color mixture in the light emitting portions in the display, thereby providing a display with high image quality.

Third Embodiment

Hereinafter, there will be described a method for fabricating an organic EL display according to a third embodiment of the present invention, with reference to the accompanying drawings.

The organic-EL-display fabricating method according to the third embodiment is different from the organic-EL-display fabricating method according to the first embodiment, in that an area to be subjected to coating by plural nozzles is restricted to at least a single pixel area. Accordingly, in the description of the third embodiment, components having the same structures as those described in the aforementioned first embodiment will be designated by the same reference characters and will not be described in the third embodiment, in such a way as to incorporate the description in the first embodiment.

FIG. 11 is a plan view illustrating, in an enlarging manner, a portion of a substrate 90 to be coated with ink 9 as a functional liquid containing an organic light-emitting material, for use in the organic-EL-display fabricating method according to the third embodiment. As illustrated in FIG. 11, the substrate 40 for use in the organic-EL-display fabricating method according to the third embodiment includes banks 3 constituted by lattice-shaped banks 3B. The lattice-shaped banks 3B are structured to surround at least a single pixel area 4 in four directions. The lattice-shaped banks 3B are formed on pixel restriction layers 10 on a base substrate, and portions of the pixel restriction layers 10 are exposed in the pixel areas 4 bounded by the lattice-shaped banks 3B. In the third embodiment, the pixel restriction layers 10 are provided on the base substrate in the shape of lines in such a way as to define the boundaries of the light emitting portions of the pixel areas 4, in parallel with one another. Also, the pixel restriction layers 10 can be provided on the base substrate, in a lattice shape, in order to define the boundaries of the light emitting portions in four directions to certainly separate the respective electrodes from one another. In the third embodiment, the pixel restriction layers 10 are provided between the same colors, in order to define the intervals between the light emitting portions having the same colors and, therefore, they are formed in parallel with one another in the shape of lines in the upward and downward directions in FIG. 11.

Ink 9 is ejected from plural nozzles 6 to the pixel areas 4 which are defined and bounded by the lattice-shaped banks 3B to apply a coating thereto, during a single scanning of the ink jet apparatus. In the third embodiment, during a single scanning, the ink 9 is ejected from eight nozzles 6 to a single pixel area 4 to apply a coating to the substrate 40. The surfaces of the lattice-shaped banks 3B which contact with the applied ink 9 have been subjected to fluorination processing, using oxygen-based gas plasma, fluorine-based gas plasma or the like. Therefore, the surfaces of the lattice-shaped banks 3B have a liquid repellent property. The lattice-shaped banks 3B have been subjected to the liquid repellent processing as described above and, therefore, even at a state where the ink 9 is bulged inside the lattice-shaped banks 3B after the coating of the ink 9 has been applied to the pixel areas 4, the ink 9 can be certainly retained within the lattice-shaped banks 3B and can be certainly contained within the lattice-shaped banks 3B. Further, on the surfaces which face to the base substrate 2 and form the pixel areas 4, there is formed a layer with a higher affinity for liquid than that of the aforementioned banks, which enables certainly applying a coating of the ink 9 to the areas which form the light emitting portions of the pixel areas 4.

Hereinafter, a complementing method performed in the organic-EL-display fabricating method according to the third embodiment will be described, in detail, with reference to the figures used in the aforementioned first embodiment.

As illustrated in FIG. 5, in order to check the ejection/non-election states of the respective nozzles 6 in the ink jet heads 5, ink 9 is ejected from the respective nozzles 6 in the ink jet heads 5 to a substrate 40 (for example, a glass substrate) to form check patterns 7 thereon.

The method for applying a coating to the substrate 40 using the ink jet heads 5 is adapted to eject ink 9 from the respective nozzles 6 successively to predetermined areas, while scanning the ink jet heads 5 over the substrate 40. At this time, the direction of scanning is the same as the direction orthogonal to the lines of the same colors on the substrate 40, as illustrated in FIG. 3. In ejection/non-ejection checking operations, the ink jet heads 5 are caused to perform provisional coating operations on the substrate 40, on the assumption that predetermined ink 9 is ejected from the nozzles 6 to the respective row areas for R, G and B.

After the ink 9 is applied to the substrate 40 from the respective nozzles 6 in the ink jet heads 5 to form the check patterns 7, the ejection states of the respective nozzles 6 are checked from the check patterns 7 on the substrate 40. If there is induced a non-ejectable nozzle, coating data is created such that complementing operations are performed using an ejectable nozzle existing in the same ejection area as that of this non-ejectable nozzle. The complementing method will be described, later. Further, in the third embodiment, the lattice-shaped banks 3B are formed such that individual ejection areas include a single pixel area.

FIG. 12 is a view illustrating the direction of scanning for the substrate 40 by the ink jet heads 5 in the ink jet apparatus and, further, illustrating a method for applying a coating to the substrate 40, in the organic-EL-display fabricating method according to the third embodiment. The ink jet heads 5 are provided with plural nozzles 6 for applying coatings of respective inks 9 for R, G and B to the substrate 40. The plural nozzles 6 are placed, such that the droplet accretion positions (so-called shot accretion positions) of the ink 9 fall within the respective ejection areas 50 surrounded by the lattice-shaped banks 3B in a scanning operation.

In FIG. 12, an arrow designated by a reference character X indicates the direction of scanning of the ink jet heads 5. Out of the ejection areas 50 illustrated in FIG. 12, an ejection area 50A represents an ejection state where coating is performed through all the normal ejectable nozzles. As illustrated in the ejection area 50A, the ink 9 is normally ejected from all the nozzles 6.

In FIG. 12, an ejection area 50B represents an ejection state where there is induced a single non-ejectable nozzle in a single ejection area. In cases where there is induced only a single non-ejectable nozzle, as represented by the ejection area 50B; coating data is created for complementing, such that, during a single scanning, an ejectable nozzle within the ejection area to be subjected to coating by the non-ejectable nozzle is caused to apply a coating of the ink 9 thereto, with a doubled amount of droplets of the ink 9, namely two droplets of the ink 9. In this case, the ejection frequency is set to twice that of normal cases (for example, 20 kHz).

In FIG. 12, an ejection area 50C represents an ejection state where there are induced continuous two non-ejectable nozzles in a single ejection area. In cases where there are induced two non-ejectable nozzles, as represented by the ejection area 50C, coating data is created for complementing, such that, during a single scanning, other two ejectable nozzles within the ejection area to be subjected to coating by the two non-ejectable nozzles are each caused to apply a coating of the ink 9 thereto, with two droplets of the ink 9. Alternatively, coating data can be created for complementing, such that, during a single scanning, a single ejectable nozzle within the ejection area to be subjected to coating by the two non-ejectable nozzles is caused to apply a coating of the ink 9 thereto, with a tripled amount of droplets of the ink 9, namely three droplets of the ink 9.

As described above, with the organic-EL-display fabricating method according to the third embodiment, ink 9 is ejected from the plural nozzles 6 to the substrate 40 having the plural ejection areas defined by the lattice-shaped banks 3B. In cases where there is no non-ejectable nozzle or during normal operations before complementing processing, the ejection frequency at which the respective nozzles 6 eject the ink 9 is set to 10 kHz, in the third embodiment. On the other hand, in cases where there is observed a non-ejectable nozzle and, thus, complementing processing is performed, the ink 9 is ejected to the substrate 40 at an ejection frequency of 20 kHz, which is twice that of normal cases. The ejection frequency is properly set, depending on the state of the existence of non-ejectable nozzles.

Further, in the third embodiment, the ejectable nozzles eject the same amount of droplets of ink 9, and this amount of droplets can be converted into a number of droplets. Further, in the third embodiment, each nozzle 6 ejects droplets of ink 9 in an amount of 5 pl (picoliters).

As described above, the ink jet apparatus for the organic-EL-display fabricating according to the third embodiment of the present invention is adapted to eject ink 9 from the plural nozzles 6 to the respective ejection areas 50 which are bounded and defined by the banks 3 constituted by the lattice-shaped banks 3B formed on the substrate 40. Accordingly, the ink jet apparatus is structured such that ejectable nozzles to be used for applying a coating to the same areas as the ejection areas 50 to be subjected to coating by non-ejectable nozzles are caused to eject an amount of droplets of ink 9 which corresponds to the number of induced non-ejectable nozzles, into the corresponding ejection areas 50, during a single scanning operation. As described above, the ink jet apparatus according to the third embodiment is capable of completing complementing processing during a single scanning operation and, thus, is capable of performing complementing processing while the ink 9 has not yet been dried. Therefore, with the method for fabricating an organic EL display according to the third embodiment, it is possible to allow the ink applied to the ejection areas to flow, which advances leveling, thereby certainly attaining uniformization of an organic light-emitting layer in the respective pixel areas for R, G and B, which form the ejection areas 50.

While, in the present specification, there have been described preferred embodiments of the present invention with respect to the first to third embodiments, the present invention is not limited to the contents indicating the structures and the fabrication processes according to the aforementioned first to third embodiments, and various changes can be made based on the same technical concepts.

For example, in the first and second embodiments, there have been described cases where there continuously exist up to 3 non-ejectable nozzles. However, in cases where there are continuous four or more non-ejectable nozzles, similarly, the areas to be coated with ink are row areas bounded by the line-shaped banks 3A. Therefore, in cases where there are continuous four or more non-ejectable nozzles, similarly, it is also possible to apply a coating thereto with the same number of droplets as the number of non-ejectable nozzles, during a single scanning, for attaining uniformization, due to the effect of flow of the ink 9 immediately after the application of the coating, thereby offering the same effects as those of the contents of the aforementioned embodiments.

Similarly, in the third embodiment, there have been described cases where there continuously exist up to 2 non-ejectable nozzles. However, in cases where there are continuous three or more non-ejectable nozzles, similarly, the areas to be coated with ink are ejection areas 50 bounded by the lattice-shaped banks 3B. Therefore, in cases where there are continuous four or more non-ejectable nozzles, similarly, it is also possible to apply a coating to the corresponding ejection areas 50 with the same number of droplets as the number of non-ejectable nozzles, during a single scanning, for attaining uniformization, due to the effect of flow of the ink 9 immediately after the application of the coating.

Further, in the third embodiment, there has been described a case where the ejection areas 50 bounded by the lattice-shaped banks 3B are each correspond to a single pixel area, namely a single sub pixel in a single pixel constituted by three sub pixels for R, G and B. However, the present invention is not limited thereto, and plural sub pixels having the same color which form a single ejection area 50 are surrounded by the lattice-shaped banks 30B.

Further, with the organic-EL-display fabricating method according to the third embodiment, the ejection areas 50 are bounded by the lattice-shaped banks 30B and, therefore, the banks 3 are formed between the pixel areas having the same colors. Accordingly, coating data is set such that no coating operation is performed by the nozzles 6 corresponding to the positions at which the banks 3 exist, in order to prevent ink 9 from being ejected from the nozzles 6 to the positions at which the banks 3 exist.

In the first to third embodiments, there have been described cases where the normal ejection frequency at which the nozzles eject ink is 10 kHz. However, the normal ejection frequency is not limited to this frequency and can be properly set according to the specifications and the like of the organic EL display to be fabricated.

Further, in the first to third embodiments, there have been described cases where the ejection frequency for complementing for non-ejectable nozzles is set to a frequency which is twice the frequency of normal ejection. However, in the present invention, the ejection frequency for complementing for non-ejectable nozzles is only required to be equal to or more than twice that of normal cases, and it is possible to perform complementing processing at shorter intervals by increasing the ejection frequency.

In the first to third embodiments, the ink jet heads are designed such that the rows of plural nozzles placed in a line shape are placed obliquely with respect to the direction of scanning, in order to set the pitch of the nozzles to about 20 micrometers (for example, 21.16666 micrometers) in the direction orthogonal to the direction of scanning. This is for causing droplets of ink ejected from the nozzles to be coupled with one another at the droplet accretion positions. Accordingly, the pitch of the nozzles in the direction orthogonal to the direction of scanning is preferably within the range of 10 micrometers to 50 micrometers, but is not required to be particularly limited.

Further, in the first to third embodiments, the amount of a single droplet of ink ejected from the nozzles is 5 pl, but this amount is preferably within the range of 1 pl to 15 pl and is not particularly limited in the present invention.

In the first to third embodiments, ink having a viscosity of 10 mPa*s is employed. However, in the present invention, the viscosity of ink is not limited to this numerical value and is preferably within the range of about 5 to 20 mPa*s, and there is no particular limitation thereon.

Further, in the first to third embodiments, in order to check the non-ejection states of nozzles, it is desirable to form check patterns at a portion of a substrate to be coated with R, G and B inks, then check the ejection/non-ejection states from the check patterns using a recognition camera and then successively apply coatings of the R, G and B inks to the substrate, based on data indicating the result of the checking. By performing ink coating processing on the substrate as described above, it is possible to perform complementing processing rapidly and certainly through a smaller number of steps for fabricating a desired high-quality organic EL display.

According to the present invention, it is possible to form uniform coating films on a substrate without degrading the productivity even in the event of occurrence of non-ejectable nozzles in an ink jet apparatus, which enables provision of a high image-quality organic EL display which exhibits no stripe-shaped ununiformity due to the existence of non-ejectable nozzles. Accordingly, the present invention has general versatility and is usable, in the fields of displays of various types of electronic apparatuses.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A method for fabricating an organic light-emitting layer as a functional-film, comprising:
    checking ejection/non-ejection states of a plurality nozzles in an ink jet head; and
    ejecting droplets of functional liquid from the plurality of nozzles to an ejection area during a single scanning of the ink jet head, the plurality of nozzles being arranged in rows with a predetermined pitch, and the ejection area being defined by being sandwiched between two or more parallel line-shaped banks, and being surrounded by bounded areas having a liquid repellent property,
    wherein, row areas defined by the line-shaped banks include a plurality of pixel areas disposed at constant intervals, said checking ejection/non-ejection states includes detecting at least one non-ejectable nozzle out of the plurality of nozzles, and said ejecting droplets of the functional liquid includes increasing the amount of droplets of the functional liquid ejected from an ejectable nozzle near the at least one non-ejectable nozzle relative to the amount of droplets of the liquid ejected from the ejectable nozzle when there is no non-ejectable nozzle so as to apply a coating to the ejection area, said increasing the amount of droplets of the functional liquid corresponding to the number of non-ejectable nozzles detected, and wherein the at least one non-ejectable nozzle includes a plurality of non-ejectable nozzles and the ejectable nozzle is an ejectable nozzle of a plurality of ejectable nozzles, and the ejection frequency at which the plurality of ejectable nozzles apply a coating of the functional liquid for complementing for the non-ejectable nozzles is equal to or more than twice the ejection frequency before the complementing.

2. The method for fabricating an organic light-emitting layer as a functional film according to claim 1, wherein
said checking includes detecting that the at least one non-ejectable nozzle is a first non-ejectable nozzle of three or more continuous non-ejectable nozzles, out of the nozzles, and wherein the ejectable nozzle is a first ejectable nozzle, and is adjacent to the first non-ejectable nozzle at a first end of the three or more continuous non-ejectable nozzles, and a second ejectable nozzle is adjacent to a second non-ejectable nozzle at a second end of the three or more continuous non-ejectable nozzles, said first and second ejectable nozzles applying a coating of the functional liquid, with an amount of droplets of the functional liquid from the first and second ejectable nozzles corresponding to the number of the three or more continuous non-ejectable nozzles.

3. The method for fabricating an organic light-emitting layer as a functional film according to claim 1, wherein
the ejectable nozzle is an ejectable nozzle of a plurality of ejectable nozzles, and one of the plurality of ejectable nozzles has a droplet accretion position within an area between the pixel areas, and applies a coating of the functional liquid, with an amount of droplets of the functional liquid from the one of the plurality of ejectable nozzles corresponding to the number of non-ejectable nozzles.

4. The method for fabricating an organic light-emitting layer as a functional film according to claim 1, wherein
the ejectable nozzle is an ejectable nozzle of a plurality of ejectable nozzles, and when the droplet accretion positions of the plurality of non-ejectable nozzles are in the pixel areas, one of the plurality of the ejectable nozzles has a droplet accretion position within an area between adjacent pixel areas and applies a coating of the functional liquid, with an amount of droplets of the functional liquid corresponding to the number of the plurality of non-ejectable nozzles, and when the plurality of non-ejectable nozzles is disposed in areas between adjacent pixel areas, one of the plurality of ejectable nozzles near the plurality of non-ejectable nozzles applies a coating of the functional liquid, with an amount of droplets of the functional liquid corresponding to the number of the plurality of non-ejectable nozzles.

5. The for fabricating an organic light-emitting layer as a functional film method according to claim 1, wherein
the ejectable nozzle applies the coating by increasing the number of droplets from the ejectable nozzle by the same number as the number of the plurality of non-ejectable nozzles.

6. The method for fabricating an organic light-emitting layer as a functional film according to claim 1, wherein
the functional film is an organic light-emitting layer in an organic electro-luminescence display.

* * * * *